United States Patent [19]

Misawa et al.

[11] Patent Number: 5,179,433
[45] Date of Patent: Jan. 12, 1993

[54] BREAKDOWN EVALUATING TEST ELEMENT

[75] Inventors: Hisanori Misawa, Tokyo; Masakazu Shiozaki, Yamato, both of Japan

[73] Assignee: Kabushiki Kaisha Toshiba, Kawasaki, Japan

[21] Appl. No.: 713,981

[22] Filed: Jun. 12, 1991

[30] Foreign Application Priority Data

Jun. 12, 1990 [JP] Japan .................. 2-153717

[51] Int. Cl.$^5$ .................. H01L 29/44; G01R 27/26
[52] U.S. Cl. .................. 257/48; 257/532
[58] Field of Search .................. 357/51, 23.6, 54; 324/158 T, 158 D

[56] References Cited

U.S. PATENT DOCUMENTS

| | | | |
|---|---|---|---|
| 4,012,757 | 3/1977 | Koo | 357/23.6 |
| 4,508,749 | 4/1985 | Brannon et al. | 357/54 |
| 4,523,372 | 6/1985 | Balda et al. | 357/54 |
| 4,805,071 | 2/1989 | Hutter et al. | 357/51 |
| 5,006,480 | 4/1991 | Chang et al. | 357/51 |

OTHER PUBLICATIONS

Wafer Charging and Beam Interactions In Ion Implantation, White et al., Solid State Technology/Feb. 1985, pp. 151-158.

A Method Of Surface Charge Neutralization During Ion Implantation, King et al., Nuclear Instruments and Methods in Physics Research B21 (1987) 396-399, North-Holland, Amsterdam (North-Holland Physics Publishing Division).

*Primary Examiner*—Jerome Jackson, Jr.
*Attorney, Agent, or Firm*—Foley & Lardner

[57] ABSTRACT

A breakdown evaluating test element insert an oxide film having thin thick portion and formed on a silicon wafer and a polysilicon film formed on the oxide film, in such a way that a capacitor is formed between the silicon wafer and the polysilicon film with the oxide film as dielectric. The area of the polysilicon film is made larger than that of the thin portion of the oxide film so that only the thin portion thereof is brought into breakdown at a predetermined probability by an electric field strength generated at the thin portion when an electric field is applied to the wafer and when no electron shower is used (no breakdown prevention countermeasure is taken) during ion implantation, for instance. Therefore, the effect of the electron shower can be confirmed by checking the resistivity of the thin oxide film portion after the wafer has been ion-implanted by using an electron shower.

7 Claims, 5 Drawing Sheets

BREAKDOWN EVALUATING TEST ELEMENT

BACKGROUND OF THE INVENTION

The present invention relates to a breakdowns evaluating test element for evaluating breakdown of semiconductor elements formed on a wafer. Such breakdowns are caused by a wafer's electrification (charge) phenomenon produced during the semiconductor manufacturing process and resulting from charged particles or plasma generated by the semiconductor manufacturing appliance.

There are two types of semiconductor manufacturing appliances. One utilizes thermochemical reaction and the other uses charged particles or plasma. In the case of the later appliance, since the energy of charged particles or the quantity of plasma can be controlled physically, it is possible to process the semiconductor devices more precisely than with the former appliance. In addition, since the semiconductor wafer is maintained at a relatively lower temperature in the charged particles or plasma process, photoresist masks are usable and therefore restrictions in semiconductor circuit design can be reduced. The semiconductor manufacturing appliances utilizing charged particles or plasma include an ion implanting apparatus, a reactive ion etching (RIE) apparatus, an oxygen asher apparatus, etc.

In semiconductor manufacturing appliances utilizing charged particles or plasma, however, there exists a problem. Charged particles are accumulated on oxide films (SiO$_2$) formed on a semiconductor or electric insulators required for the photoresist forming process, so that precise processing becomes difficult. Further, in cases of excess accumulation, the gate oxide films of semiconductor elements (e.g. transistors) are damaged or brought into breakdown. Since the damage or dielectric breakdown of gate oxide films cannot be repaired, it is indispensable to provide means for preventing semiconductor devices from breakdown resulting from the semiconductor manufacturing appliance which utilizes charged particles or plasma.

As the breakdown prevention appliance, a so-called electron shower (electron flood) system, for instance, is known in the case of the ion implanting appliance. In this system, a wafer to which ions are being implanted is irradiated with an electron beam to neutralize the positive charge accumulated by ions or to reduce the quantity of accumulated electric charge.

In the semiconductor manufacturing appliance which adopts this breakdown prevention countermeasure, it is necessary to periodically test the breakdown prevention effect. An example of the test method is disclosed in Solid State Technology Magazine, pages 151 to 158, Feb. 1985. The charged state of a wafer to which ions are implanted or plasma electric field is applied by the appliance to be tested is measured by a measurement unit including a capacity charge sensor as shown in FIG. 11.

In more detail, with reference to FIGS. 11A to 11C, a sensor electrode 2 is disposed above a tested wafer 1. The output of this sensor electrode 2 is connected to an oscilloscope 3 so that the charged state of the sensor electrode 2 can be monitored as a waveform on the display of the oscilloscope 3.

In measurement, the tested wafer 1 is moved below and in parallel to the sensor electrode 2 in the arrow directions as shown in FIGS. 11A to 11C. In this measurement, since the electric charge opposite in polarity to that charged on the surface of the wafer 1 is induced on the sensor electrode 2, it is possible to monitor the charged state on the wafer 1 as the induced charged state on the display of the oscilloscope 3. For instance, if the wafer 1 is charged positive, since the sensor electrode 2 is induced negative, a positive pulse waveform can be monitored by the oscilloscope 3. By use of this test unit, accordingly, the charged state of the wafer 1 can be known on the basis of the presence or absence or polarity or amplitude of the pulse waveform; that is, it is possible to check whether the electron shower system operates normally or not.

In the above-mentioned test method using the capacity charge sensor, the entire charged state of the wafer 1 is checked macroscopically. Where the wafer 1 is charged negative or positive non-uniformly, as shown in FIG. 12, no pulse is generated as if the wafer 1 is not charged. Further, where the wafer 1 is charged negative as a whole except for a local positive charge, the minor charge is neglected, and the prior-art test unit cannot accurately check the charged state distribution on the wafer 1.

There also exists a method of microscopically checking manufactured wafers. In this method, however, the wafers are tested after all the manufacturing process till ion implantation has been completed. Problems exist in that the tested wafers are wasted and therefore it is uneconomical or it takes much time to test the wafer 1 or the charged state on the wafer cannot be checked accurately according to the wafer's charged state.

SUMMARY OF THE INVENTION

With these problems in mind, therefore, it is the object of the present invention to provide a breakdown evaluating test element, which can check the breakdown of the semiconductor elements on a wafer, diagnose the effect of the breakdown prevention countermeasure, and additionally check the charged state distribution on the wafer, without wasting wafers manufactured through the production process.

The breakdown evaluating test element of the present invention comprises an oxide film having a thin portion and a thick portion and formed on a silicon wafer; and a polysilicon film formed on and extending to both the thin and thick portions of the oxide film. The structure is such that a capacitor is formed between electrodes of the silicon wafer and the polysilicon film with the oxide film as dielectric. The invention is further characterized in that the area of the polysilicon film is determined to be sufficiently larger than that of the thin portion of the oxide film so that the thin portion of the oxide film is brought into breakdown at a predetermined probability by an electric field strength generated at the thin portion of the oxide film when an electric field is applied to the wafer, without taking any breakdown prevention countermeasure during the manufacturing process.

According to the present invention, since the test element is provided with a capacitor whose silicon oxide film is brought into breakdown at a predetermined probability when a predetermined electric field is applied to the wafer without taking any breakdown prevention countermeasure during the manufacturing process, it is possible to confirm the effect of the breakdown prevention countermeasure by checking whether the insulation can be maintained on the basis of the resistance of the thin portion of the oxide film of capacitor structure, after the test element has been processed (e.g. ion implantation) so as not to be brought into breakdown by taking breakdown prevention countermeasure (e.g. electron shower).

Further, when a plurality of capacitors are scatteringly formed all over the wafer, it is possible to know the electric charged state distribution on the wafer on the basis of the resistivity distribution, thus allowing the charged state on the wafer to be accurately checked.

DESCRIPTION OF THE PREFERRED EMBODIMENTS

Embodiments of the present invention will be described hereinbelow with reference to the attached drawings.

Figure 1:
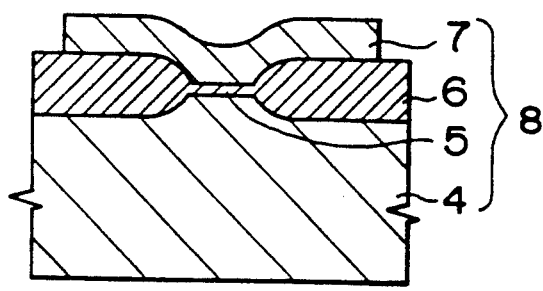
FIG. 1 is a cross-sectional view showing a first embodiment of the test element according to the present invention.
Figure 2:
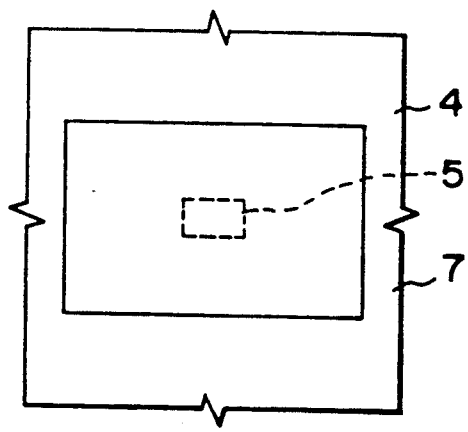
FIG. 2 is a plan view showing the same test element shown in FIG. 1.

FIGS. 1 and 2 show a first embodiment of the present invention. In these drawings, a thin oxide film ($SiO_2$) portion 5 with a thickness of about 250 Å is formed on a silicon wafer 4 by thermal oxidation, and a thick oxide film ($SiO_2$ portion 6 with a thickness of about 8000 Å is formed around the thin oxide film portion 5 by selective oxidation technique or LOCOS (localized oxidation of silicon) technique. In the ordinary semiconductor element, the thin oxide film portion 5 corresponds to a gate oxide film and the thick oxide film portion 6 corresponds to an element separating oxide film from the structural standpoint.

Further, a polysilicon film 7 doped by phosphorus (P) is formed so as to extend over both the oxide film portions 5 and 6. Therefore, a capacitor 8 is formed with the polysilicon film 7 and the wafer 4 as electrodes and with the two oxide film portions 5 and 6 as dielectric. When an electric field is applied to the element as described above by ion implantation, for instance, electric charge is accumulated in the capacitor 8, and the intensity of the electric field becomes high at the thin oxide film portion 5.

Here, a voltage applied to the thin oxide film portion 5 can be calculated as $$V = Q/C$$

where V denotes a potential between the polysilicon film 7 and the wafer 4; Q denotes the storaged charge; and C denotes the capacitance. When the voltage V exceeds a breakdown voltage $V_B$ of the thin oxide film portion 5, the thin oxide film portion 5 is brought into breakdown, and the resistivity between the polysilicon film 7 and the wafer 4 drops suddenly. Therefore, it is possible to check whether the potential V generated on the surface of the wafer 4 by charge accumulated during ion implantation exceeds the breakdown voltage $V_B$, by measuring the resistivity after ion implantation.

The area of the polysilicon film 7 is determined broader than that of the thin oxide film portion 5 so that the thin oxide film portion 5 is brought into breakdown at a predetermined probability by the electric field strength generated at the thin oxide film portion 5 during a manufacturing process in which no breakdown prevention countermeasure is taken to the wafer 4.

Figure 9:
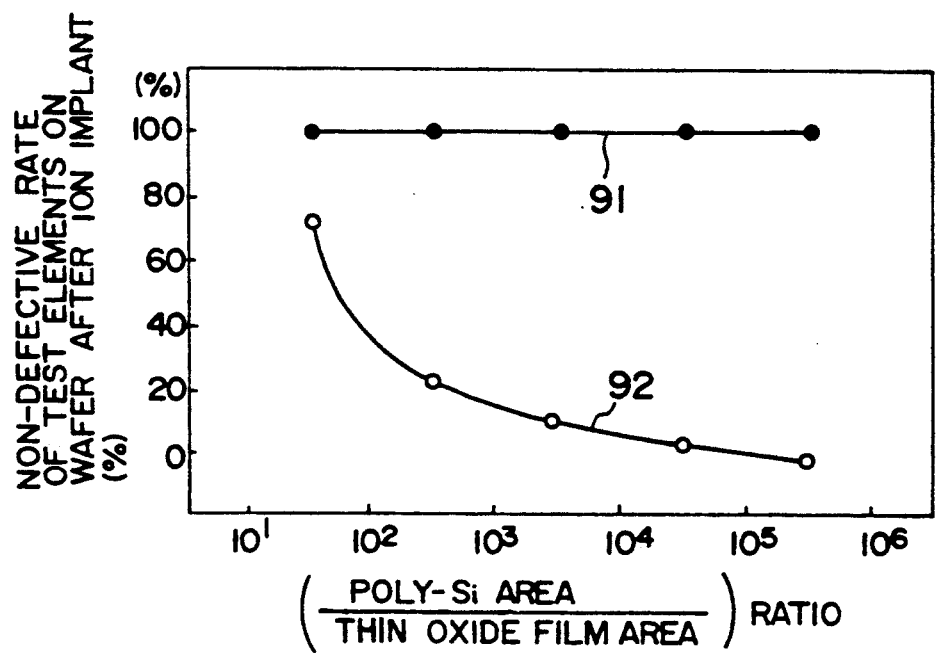
FIG. 9 is a graphical representation showing data obtained by measuring the resistivity of the test elements shown in FIGS. 1 and 2, after ions have been implanted to the test elements.
Figure 11A:
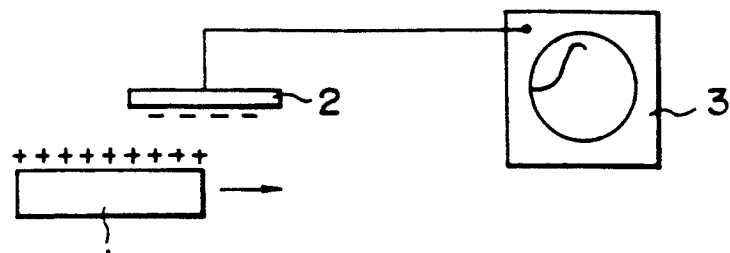
FIGS. 11(A), (B) and (C) are illustrations for assistance in explaining a prior-art charge measuring unit using a capacitor charge sensor.
Figure 11B:
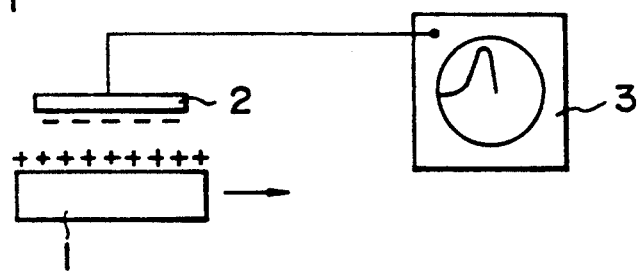
Figure 11C:
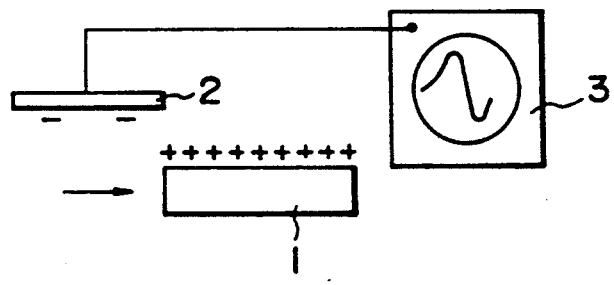
Figure 12:
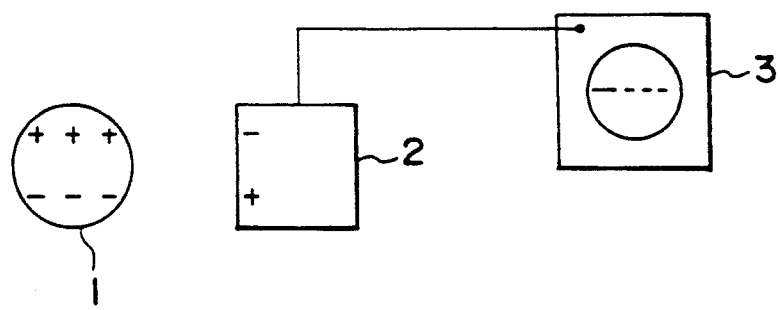
FIGS. 12 and 13 are illustrations for assistance in explaining problems involved in the prior-art charged state measuring unit.
Figure 13:
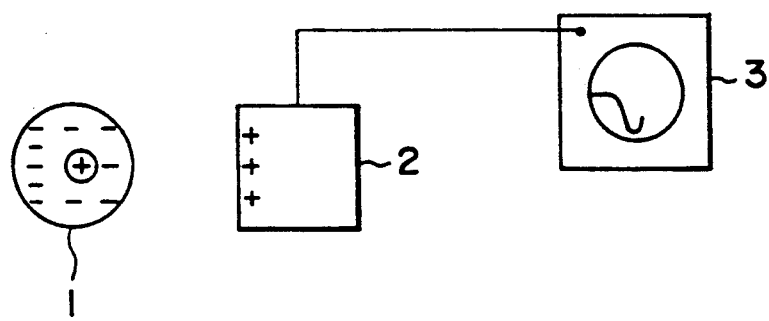

FIG. 9 indicates data obtained by measuring the resistivity of the test elements as shown in FIGS. 1 and 2, after $As^+$ ions have been implanted under the conditions that the ion energy is 50 keV; the dose is $5 \times 10^{15}$ $cm^{-2}$; and the beam current is 5 mA.

In the above measurement, 100 pieces of the polysilicon films 7 of 5 different areas (i.e. 20 pieces per same area) are formed on the same wafer under the condition that the area of the thin oxide film portion 5 is constant. Further, the test was performed by separating the test elements ion-implanted in electron shower from those ion-implanted without electron shower. In FIG. 9, the abscissa axes indicates the ratio of the area of the polysilicon film 7 to that of the thin oxide film portion 5, and the ordinate axis indicates the ratio of the number of non-defective test elements (no breakdown occurs) to the total test elements. Further, the numeral 91 denotes the data obtained by using electron shower, and 92 denotes the data obtained without electron shower.

FIG. 9 indicates that the non-defective rate obtained by using electron shower is 100%; that is, the charged state caused during ion implantation can be properly suppressed. On the other hand, when the electron shower is not used, the defective rate (non-defective percentage subtracted from 100%) due to breakdown of the test elements after ion implantation is 80% or more when the area ratio (polysilicon 7/thin oxide film portion 5) exceeds 1000, thus indicating that the test elements have sufficiently high sensitivity to breakdown phenomenon.

Therefore, it is preferable to form the polysilicon film 7 so that the area ratio (polysilicon film 7/thin oxide film 5) becomes 1000 or more, from the standpoint of test sensitivity, because the curve 92 changes from the sharp state to the gentle state, with the area ratio of 1000 as a border, into a high sensitivity range. Further, the lower limit of the area ratio is about 1000, and the upper limit thereof may be about $10^{10}$, considering the practical size of the wafer.

As described above, according to the present invention, since the test element is provided with a capacitor 8 whose dielectric or thin oxide film portion 5 is brought into breakdown at a predetermined probability after the manufacturing process (in which a predetermined electric field is applied to the wafer 4) been completed without taking any breakdown prevention countermeasure, it is possible to confirm the effect of the breakdown prevention countermeasure such as electron shower, by checking the insulation characteristics at the thin oxide film portion 5 on the basis of the resistivity of the capacitor 8, after the test element has been processed by taking a breakdown prevention countermeasure (e.g. electron shower).

Figure 10:
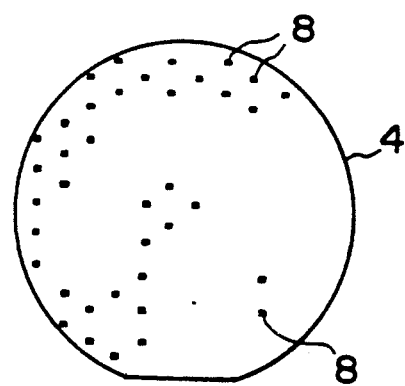
FIG. 10 is a plan view showing an example of test element distribution formed on a wafer when the charged state distribution is checked.

Further, when a number of capacitors 8 are formed scattered all over the wafer 4 as shown in FIG. 10, since it is possible to know the entire charged state distribution on the wafer 4 on the basis of the resistivity distribution, the charged state on the wafer 4 can be checked more accurately.

FIGS. 3 to 8 are cross-sectional views showing other embodiments of the test element according to the present invention. The structural features of these embodiments are modified so as to correspond to various shapes of the polysilicon films or the photoresists formed at the practical manufacturing process such as ion implantation or plasma application.

Figure 3:
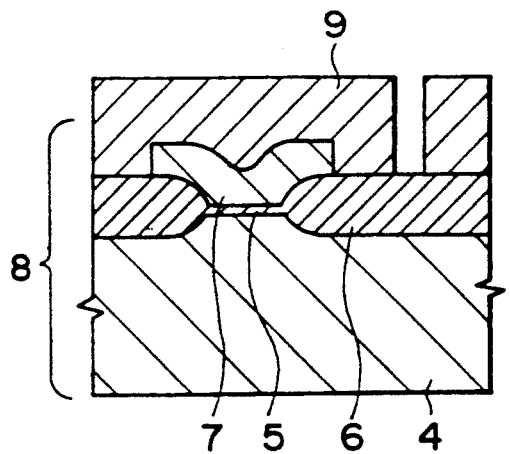
FIG. 3 is a cross-sectional view showing a second embodiment of the test element according to the present invention.
Figure 4:
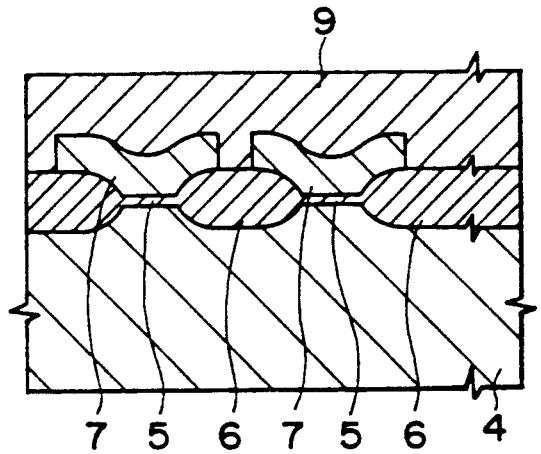
FIG. 4 is a cross-sectional view showing a third embodiment of the test element according to the present invention.
Figure 5:
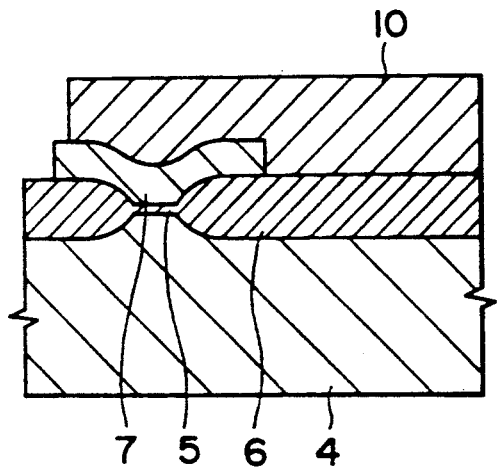
FIG. 5 is a cross-sectional view showing a fourth embodiment of the test element according to the present invention.
Figure 6:
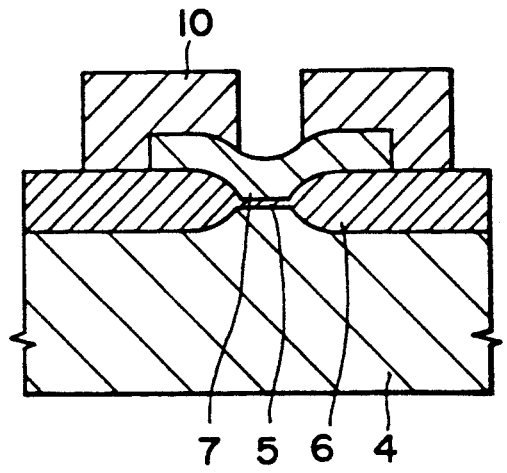
FIG. 6 is a cross-sectional view showing a fifth embodiment of the test element according to the present invention.
Figure 7:
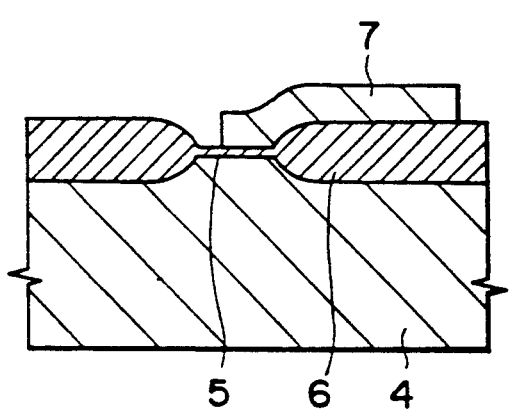
FIG. 7 is a cross-sectional view showing a sixth embodiment of the test element according to the present invention.
Figure 8:
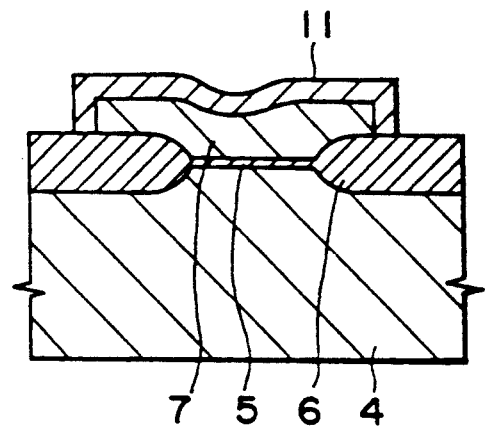
FIG. 8 is a cross-sectional view showing a seventh embodiment of the test element according to the present invention.

In FIG. 3, the capacitor 8 is covered by an independent photoresist 9 not connected to other surrounding photoresists. In FIG. 4, the wafer 4 is entirely covered by a photoresist 9. In FIG. 5, a photoresist 10 is formed by patterning process so that a part of the polysilicon film 7 is exposed. In FIG. 6, a photoresist 10 is formed by a patterning process, so that a part of polysilicon film 7 just over the thin oxide film portion 5 is exposed. In FIG. 7, the polysilicon film 7 is formed so that a part of the thin oxide film portion 5 is exposed. In FIG. 8, another oxide film 11 is formed by oxidizing the polysilicon film 7 within high temperature atmosphere, after the capacitor 8 as shown in FIG. 1 has been formed.

As described above, in the test element of the present invention, since the test element is provided with a capacitor whose silicon oxide film is brought into breakdown at a predetermined probability after the manufacturing process for applying a predetermined electric field to the wafer has been completed without taking any breakdown prevention countermeasure, it is possible to confirm the effect of the breakdown prevention countermeasure such as electron shower, by checking whether the insulation can be maintained on the basis of the resistance of the thin silicon oxide film portion of the capacitor after the test element has been processed so as not to be brought into breakdown by taking breakdown prevention countermeasure such as electron shower.

Further, when a plurality of capacitors 8 are formed scattered all over the wafer, the distribution of charge state on the wafer can be known on the basis of the distribution of the resistivity of the capacitors, thus allowing the charged state on the wafer to be checked accurately.

What is claimed is:

1. A breakdown evaluating test element comprising:
   a silicon wafer;
   a thin oxide film formed on said wafer;
   a thick oxide film formed on said wafer, said thick oxide film being located on a peripheral portion of said thin film; and
   a polysilicon film formed on both said thin and thick oxide films; and wherein,
   a first area of said polysilicon film covers an area of said thick oxide film which is substantially greater than a second area of said polysilicon film covering said thin oxide film, such that, when an electric field is applied to the wafer during a manufacturing process, the thin oxide film has a predetermined probability of breaking down from the strength of an electric field resulting from electric charge accumulated in a capacitor formed by said silicon wafer as a first electrode, said polysilicon film as a second electrode said thin and thick oxide films as a dielectric.

2. The breakdown evaluating test element as claimed in claim 1, wherein a plurality of the capacitors are formed scattered on the silicon wafer.

3. The breakdown evaluating test element as claimed in claim 1, wherein the area of the thick portion of the oxide film is at least 1000 times greater than that of the thin portion of the oxide film.

4. The breakdown evaluating test element as claimed in claim 1, wherein the polysilicon film is formed on the oxide film in such a way as to expose part of the thin portion of the oxide film.

5. The breakdown evaluating test element as claimed in claim 1, wherein another oxide film is formed on the polysilicon film.

6. The breakdown evaluating test element as claimed in claim 1, wherein said polysilicon film is completely covered with a photo resist film.

7. The breakdown evaluating test element as claimed in claim 1, wherein said polysilicon film is partially covered with a photo resist film and a part of said polysilicon film is exposed.

* * * * *